(12) United States Patent
Bae et al.

(10) Patent No.: US 7,710,735 B2
(45) Date of Patent: May 4, 2010

(54) MULTICHIP PACKAGE SYSTEM

(75) Inventors: JoHyun Bae, Seoul (KR); In Sang Yoon, Jr., Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 151 days.

(21) Appl. No.: 11/278,418

(22) Filed: Apr. 1, 2006

(65) Prior Publication Data
US 2007/0235216 A1    Oct. 11, 2007

(51) Int. Cl.
*H05K 7/00* (2006.01)
(52) U.S. Cl. .................................. 361/735; 174/260
(58) Field of Classification Search .............. 174/260, 174/520, 521, 522, 30–31 R; 361/735
See application file for complete search history.

(56) References Cited

U.S. PATENT DOCUMENTS

| | | | |
|---|---|---|---|
| 5,258,330 A | 11/1993 | Khandros et al. | |
| 6,147,401 A | 11/2000 | Solberg | |
| 6,798,049 B1 * | 9/2004 | Shin et al. | 257/678 |
| 6,956,284 B2 | 10/2005 | Cady et al. | |
| 6,962,865 B2 | 11/2005 | Hanaoka et al. | |
| 6,964,915 B2 | 11/2005 | Farnworth et al. | |
| 6,965,160 B2 | 11/2005 | Cobbley et al. | |
| 7,034,387 B2 * | 4/2006 | Karnezos | 257/686 |
| 7,211,900 B2 * | 5/2007 | Shin et al | 257/777 |
| 7,298,045 B2 * | 11/2007 | Fujitani et al. | 257/724 |
| 2003/0201526 A1 * | 10/2003 | Bolken et al. | 257/686 |
| 2007/0176278 A1 * | 8/2007 | Wang | 257/686 |
| 2007/0235215 A1 * | 10/2007 | Bathan et al. | 174/260 |
| 2007/0284139 A1 * | 12/2007 | Chin et al. | 174/260 |

* cited by examiner

*Primary Examiner*—Jinhee J Lee
*Assistant Examiner*—Yuriy Semenenko
(74) *Attorney, Agent, or Firm*—Mikio Ishimaru (57) ABSTRACT

A multichip integrated circuit package system is provided attaching a first integrated circuit die on a substrate top surface, mounting a second integrated circuit die over the first integrated circuit die, connecting an external interconnect on a substrate bottom surface, and forming a first encapsulation having a recess to expose a portion of the substrate bottom surface and the external interconnect.

20 Claims, 3 Drawing Sheets

MULTICHIP PACKAGE SYSTEM

TECHNICAL FIELD

The present invention relates generally to integrated circuit packages and more particularly to stacked integrated circuit packages.

BACKGROUND ART

Every new generation of integrated circuits with increased operating frequency, performance and the higher level of large scale integration have underscored the need for the integrated circuit packaging to meet the high speed signaling requirements of the integrated circuits. Modern consumer electronics, such as smart phones, personal digital assistants, and location based services devices, as well as enterprise electronics, such as servers and storage arrays, are packing more integrated circuits into an ever shrinking physical space with expectations for decreasing cost. Contemporary consumer electronics expose integrated circuits and packages to more demanding and sometimes new environmental conditions, such as cold, heat, and humidity requiring integrated circuit packages to provide robust thermal management structures.

As more functions are packed into the integrated circuits and more integrated circuits into the package, the packaged integrated circuits reliably provide the high performance across specified environmental conditions. The integrated circuits bare a portion of performance assurance over various conditions. The integrated circuit package also bares a portion of the performance assurance and in some case more than the integrated circuits.

Numerous technologies have been developed to meet these requirements. Some of the research and development strategies focus on new package technologies while others focus on improving the existing and mature package technologies. Research and development in the existing package technologies may take a myriad of different directions.

One proven way to reduce cost is to use package technologies with existing manufacturing methods and equipments. Paradoxically, the reuse of existing manufacturing processes does not typically result in the reduction of package dimensions. Existing packaging technologies struggle to cost effectively meet the ever demanding integration of today's integrated circuits and packages.

In response to the demands for improved packaging, many innovative package designs have been conceived and brought to market. The multi-chip package has achieved a prominent role in reducing the board space. Numerous package approaches stack multiple integrated circuits, package level stacking, or package-on-package (POP). Known-good-die KGD and assembly process yields are not an issue since each package can be tested prior to assembly, allowing KGD to be used in assembling the stack. But stacking integrated devices, package-on-package, or a combination thereof have system level difficulties, such as increased package height composed of two ordinary packages or package structures not optimal for high performance integrated circuits.

Thus, a need still remains for a multichip package system providing low cost manufacturing, improved yields, increased electrical performance, reduced integrated circuit package dimensions, and integration configurations. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a multichip package system including attaching a first integrated circuit die on a substrate top surface, mounting a second integrated circuit die over the first integrated circuit die, connecting an external interconnect on a substrate bottom surface, and forming a first encapsulation having a recess to expose a portion of the substrate bottom surface and the external interconnect.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material, patterning, exposure, development, etching, cleaning, molding, and/or removal of the material or as required in forming a described structure.

Figure 1:
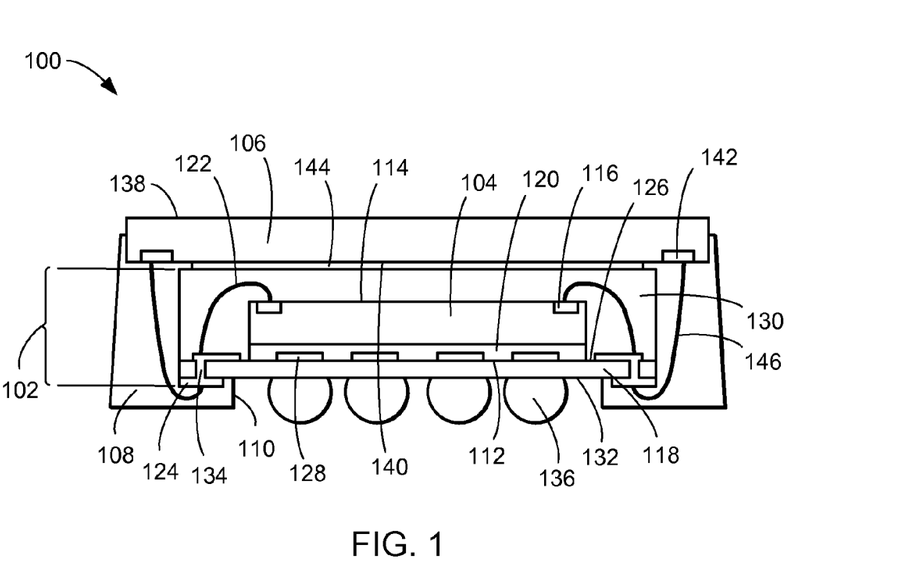
FIG. 1 is a cross-sectional view of a first multichip package system in an embodiment of the present invention.

Referring now to FIG. 1, therein is shown a cross-sectional view of a first multichip package system 100 in an embodiment of the present invention. The first multichip package system 100 includes a first integrated circuit package 102 having a first integrated circuit die 104, such as a memory device, and a second integrated circuit die 106, such as a microprocessor, microcontroller, or application specific integrated circuit (ASIC), mounted on the first integrated circuit package 102. A package encapsulation 108 having a recess 110 partially covers the first integrated circuit package 102 and the second integrated circuit die 106.

The first integrated circuit package 102 is a pre-packaged device and may be tested prior to assembly ensuring known good device (KGD). The first integrated circuit die 104 has a first non-active side 112 and a first active side 114 having circuitry and first bond pads 116 thereon. The first non-active side 112 attaches to a substrate 118, such as a flexible substrate or a dielectric sheet, with a first adhesive 120, such as a die-attach adhesive. First interconnects 122, such as bond wires or ribbon bond wires, connect between the first bond pads 116 and flexible leads 124 on a peripheral portion of a substrate top surface 126. The flexible leads 124 connect to conductive traces 128 of the substrate 118. A first encapsulation 130 covers the first integrated circuit die 104 and the first interconnects 122 on the substrate top surface 126.

The conductive traces 128 are also on a substrate bottom surface 132. Electrical vias 134 connect the conductive traces 128 between the substrate top surface 126 and the substrate bottom surface 132 at a predetermined configuration. The conductive traces 128 may be at the periphery of the substrate 118. External interconnects 136, such as solder balls, connect to the conductive traces 128 on the substrate bottom surface 132 for connections to the next system level (not shown), such as a printed circuit board or another integrated circuit package.

The second integrated circuit die 106 has a second non-active side 138 and a second active side 140 having circuitry and second bond pads 142 fabricated thereon. The second integrated circuit die 106 is inverted with the second active side 140 attached with a second adhesive 144, such as a die-attach adhesive, on a top of the first encapsulation 130 of the first integrated circuit package 102. Second interconnects 146, such as bond wires or ribbon bond wires, connect between the second bond pads 142 and the flexible leads 124 on a peripheral portion of the substrate bottom surface 132. The first encapsulation 130 does not impede the connections of the second interconnects 146 to the second bond pads 142.

The package encapsulation 108 covers the second active side 140 of the second integrated circuit die 106 and the second interconnects 146. The second non-active side 138 of the second integrated circuit die 106 exposes to ambient. The package encapsulation 108 covers the first encapsulation 130 of the first integrated circuit package 102 and the substrate 118 adjacent to the first interconnects 122 attached to the substrate bottom surface 132. The recess 110 exposes the non-periphery portion of the substrate 118 and the external interconnects 136. The package encapsulation 108 below the substrate 118 does not impede connections of the external interconnects 136 to the next system level.

The first multichip package system 100 places the first integrated circuit die 104 and the second integrated circuit die 106 close to each other and to the next system level. This minimal distance allows high speed communication with potentially lower electrical swing signals between the first integrated circuit die 104 and the second integrated circuit die 106 as well as to the next system level resulting in performance improvement and lower power consumption. The first interconnects 122 and the second interconnects 146 both as ribbon bond wires may further improve the electrical performance. For example, the second integrated circuit die 106 may be a processor requiring high speed memory access, such as an external level 1 (L1) cache. The first integrated circuit die 104 may be the L1 memory. Communication between the processor and the L1 cache may be both high speed and low power. Further, the processor or the memory chip may communicate with the next system level through the substrate 118 and the external interconnects 136.

Figure 2:
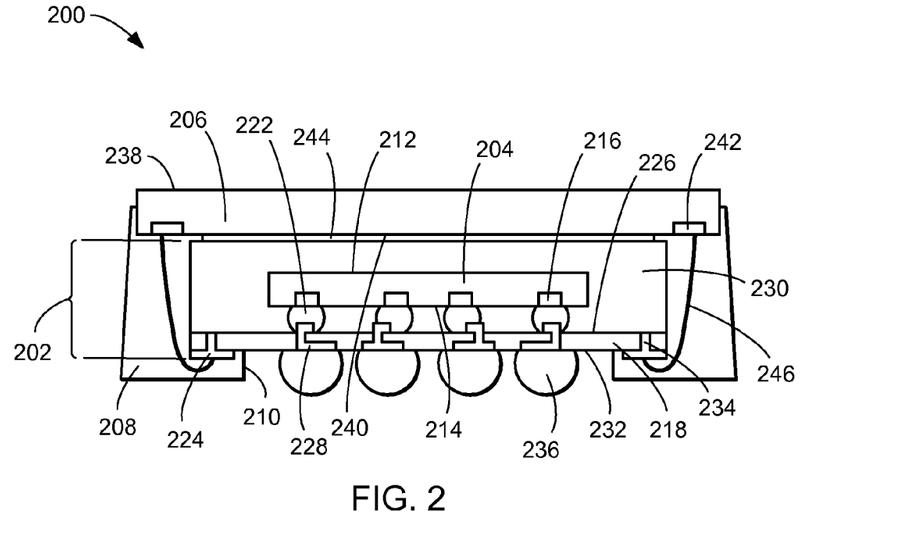
FIG. 2 is a cross-sectional view of a second multichip package system in an alternative embodiment of the present invention.

Referring now to FIG. 2, therein is shown a cross-sectional view of a second multichip package system 200 in an alternative embodiment of the present invention. The second multichip package system 200 includes a first integrated circuit package 202 having a first integrated circuit die 204, such as a memory device, and a second integrated circuit die 206, such as a microprocessor, microcontroller, or application specific integrated circuit (ASIC), mounted on the first integrated circuit package 202. A package encapsulation 208 having a recess 210 partially covers the first integrated circuit package 202 and the second integrated circuit die 206.

The first integrated circuit package 202 is a pre-packaged device and may be tested prior to assembly ensuring known good device (KGD). The first integrated circuit die 204 has a first non-active side 212 and a first active side 214 having circuitry and first bond pads 216 thereon. The first active side 214 attaches to a substrate 218, such as a flexible substrate or a dielectric sheet, with first interconnects 222, such as solder bumps or solder balls. The first interconnects 222 connect between the first bond pads 216 and flexible leads 224 on a substrate top surface 226. The flexible leads 224 connect to conductive traces 228 of the substrate 218. A first encapsulation 230 covers the first integrated circuit die 204 and the first interconnects 222 on the substrate top surface 226.

The conductive traces 228 are also on a substrate bottom surface 232. Electrical vias 234 connect the conductive traces 228 between the substrate top surface 226 and the substrate bottom surface 232 in a predetermined configuration. The conductive traces 228 may be at the periphery of the substrate 218. External interconnects 236, such as solder balls, connect to the conductive traces 228 on the substrate bottom surface 232 for connections to the next system level (not shown), such as a printed circuit board or another integrated circuit package.

The second integrated circuit die 206 has a second non-active side 238 and a second active side 240 having circuitry and second bond pads 242 fabricated thereon. The second integrated circuit die 206 is inverted with the second active side 240 attached with an adhesive 244, such as a die-attach adhesive, on a top of the first encapsulation 230 of the first integrated circuit package 202. Second interconnects 246, such as bond wires or ribbon bond wires, connect between the second bond pads 242 and the flexible leads 224 on a peripheral portion of the substrate bottom surface 232. The first encapsulation 230 does not impede the connections of the second interconnects 246 to the flexible leads 224.

The package encapsulation 208 covers the second active side 240 of the second integrated circuit die 206 and the second interconnects 246. The second non-active side 238 of the second integrated circuit die 206 exposes to ambient. The package encapsulation 208 covers the first encapsulation 230 of the first integrated circuit package 202 and the substrate 218 adjacent to the second interconnects 246 attached to the substrate bottom surface 232. The recess 210 exposes the non-periphery portion of the substrate 218 and the external interconnects 236. The package encapsulation 208 below the substrate 218 does not impede connections of the external interconnects 236 to the next system level.

The first multichip package system 100 places the first integrated circuit die 204 and the second integrated circuit die 206 close to each other and to the next system level. This minimal distance allows high speed communication with potentially lower electrical swing signals between the first integrated circuit die 204 and the second integrated circuit die 206 as well as to the next system level resulting in performance improvement and lower power consumption. The first interconnects 222 and the second interconnects 246 both as ribbon bond wires may further improve the electrical performance. For example, the second integrated circuit die 206 may be a processor requiring high speed memory access, such as an external level 1 (L1) cache. The first integrated circuit die 204 may be the L1 memory. Communication between the processor and the L1 cache may be both high speed and low power. Further, the processor or the memory chip may communicate with the next system level through the substrate 218 and the external interconnects 236.

Figure 3:
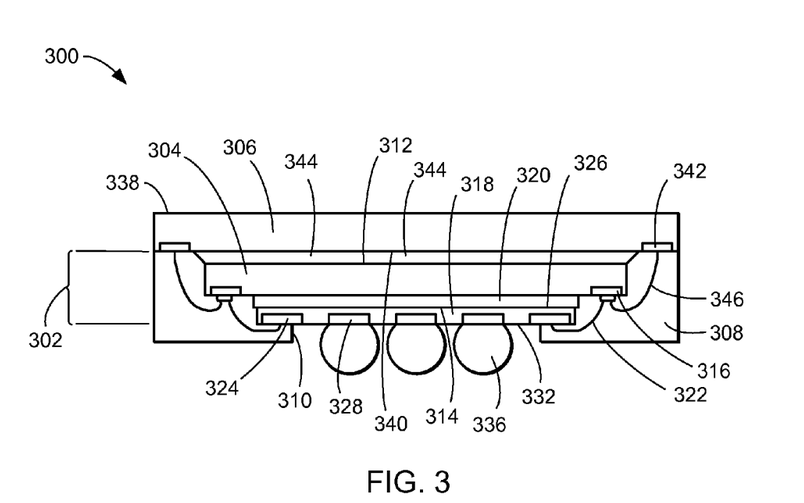
FIG. 3 is a cross-sectional view of a third multichip package system in another alternative embodiment of the present invention.

Referring now to FIG. 3, therein is shown a cross-sectional view of a third multichip package system 300 in another alternative embodiment of the present invention. The third multichip package system 300 includes a first integrated circuit die 304, such as a memory device, and a second integrated circuit die 306, such as a microprocessor, microcontroller, or application specific integrated circuit (ASIC), mounted on the first integrated circuit die 304. A package encapsulation 308 having a recess 310 covers the first integrated circuit die 304 and partially covers the second integrated circuit die 306.

The first integrated circuit die 304 has a first non-active side 312 and a first active side 314 having circuitry and first bond pads 316 thereon. The first integrated circuit die 304 is inverted with the first active side 314 attached with a first adhesive 320, such as a die-attach adhesive, on a substrate 318, such as a flexible substrate or a dielectric sheet. First interconnects 322, such as bond wires or ribbon bond wires, connect between the first bond pads 316 and flexible leads 324 on a peripheral portion of a substrate bottom surface 332. The flexible leads 324 connect to conductive traces 328 of the substrate 318. The substrate 318 does not impede the connections of the first interconnects 322 to the first bond pads 316.

The conductive traces 328 may also be on a substrate top surface 326. Electrical vias (not shown) may connect the conductive traces 328 between the substrate top surface 326 and the substrate bottom surface 332 in a predetermined configuration. The conductive traces 328 may be at the periphery of the substrate 318. External interconnects 336, such as solder balls, connect to the conductive traces 328 on the substrate bottom surface 332 for connections to the next system level (not shown), such as a printed circuit board or another integrated circuit package.

The second integrated circuit die 306 has a second non-active side 338 and a second active side 340 having circuitry and second bond pads 342 fabricated thereon. The second integrated circuit die 306 is inverted with the second active side 340 attached with a second adhesive 344, such as a die-attach adhesive, on the first non-active side 312 of the first integrated circuit die 304. Second interconnects 346, such as bond wires or ribbon bond wires, connect between the second bond pads 342 and the first bond pads 316. The first integrated circuit die 304 does not impede the connections of the second interconnects 346.

The package encapsulation 308 covers the second active side 340 of the second integrated circuit die 306 and the second interconnects 346. The second non-active side 338 of the second integrated circuit die 306 exposes to ambient. The package encapsulation 308 also covers the first integrated circuit die 304, the first interconnects 322, and the substrate 318 adjacent to the first interconnects 322 attached to the substrate bottom surface 332. The recess 310 exposes the non-periphery portion of the substrate 318 and the external interconnects 336. The package encapsulation 308 below the substrate 318 does not impede connections of the external interconnects 336 to the next system level.

The third multichip package system 300 places the first integrated circuit die 304 and the second integrated circuit die 306 close to each other and to the next system level. This minimal distance allows high speed communication with potentially lower electrical swing signals between the first integrated circuit die 304 and the second integrated circuit die 306 as well as to the next system level resulting in performance improvement and lower power consumption. The first interconnects 322 and the second interconnects 346 both as ribbon bond wires may further improve the electrical performance. For example, the second integrated circuit die 306 may be a processor requiring high speed memory access, such as an external level 1 (L1) cache. The first integrated circuit die 304 may be the L1 memory. Communication between the processor and the L1 cache may be both high speed and low power. Further, the processor or the memory chip may communicate with the next system level through the substrate 318 and the external interconnects 336.

Figure 4:
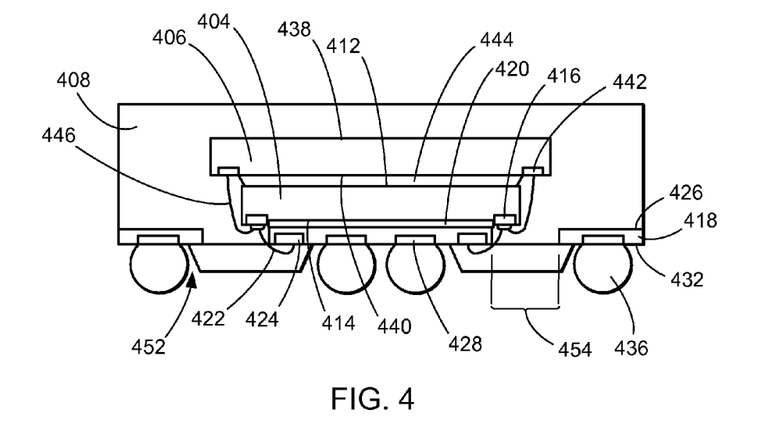
FIG. 4 is a cross-sectional view of a fourth multichip package system in yet another alternative embodiment of the present invention.

Referring now to FIG. 4, therein is shown a cross-sectional view of a fourth multichip package system 400 in yet another alternative embodiment of the present invention. The fourth multichip package system 400 includes a first integrated circuit die 404, such as a memory device, and a second integrated circuit die 406, such as a microprocessor, microcontroller, or application specific integrated circuit (ASIC), mounted on the first integrated circuit die 404. A package encapsulation 408 having recessed surfaces 452 covers the first integrated circuit die 404 and the second integrated circuit die 406.

The first integrated circuit die 404 has a first non-active side 412 and a first active side 414 having circuitry and first bond pads 416 thereon. The first integrated circuit die 404 is inverted with the first active side 414 attached with a first adhesive 420, such as a die-attach adhesive, on a substrate 418, such as a flexible substrate or a dielectric sheet. First interconnects 422, such as bond wires or ribbon bond wires, connect between the first bond pads 416 and flexible leads 424 on a substrate bottom surface 432. The flexible leads 424 connect to conductive traces 428 of the substrate 418. The first interconnects 422 connect to the substrate bottom surface 432 through openings 454 of the substrate 418. The substrate 418 does not impede the connections of the first interconnects 422 to the first bond pads 416.

The conductive traces 428 may also be on a substrate top surface 426. Electrical vias (not shown) may connect the conductive traces 428 between the substrate top surface 426 and the substrate bottom surface 432 in a predetermined configuration. The conductive traces 428 may be at the periphery of the substrate 418. External interconnects 436, such as solder balls, connect to the conductive traces 428 on the substrate bottom surface 432 for connections to the next system level (not shown), such as a printed circuit board or another integrated circuit package.

The second integrated circuit die 406 has a second non-active side 438 and a second active side 440 having circuitry and second bond pads 442 fabricated thereon. The second integrated circuit die 406 is inverted with the second active side 440 attached with a second adhesive 444, such as a die-attach adhesive, on the first non-active side 412 of the first integrated circuit die 404. Second interconnects 446, such as bond wires or ribbon bond wires, connect between the second bond pads 442 and the first bond pads 416. The second interconnects 446 may connect to the first bond pads 416 through the openings 454. The first integrated circuit die 404 and the substrate 418 do not impede the connections of the second interconnects 446.

The package encapsulation 408 covers the first integrated circuit die 404, the first interconnects 422, the second integrated circuit die 406, and the second interconnects 446. The package encapsulation 408 also fills the openings 454 forming the recessed surfaces 452 exposing the substrate bottom surface 432 and the external interconnects 436. The package encapsulation 408 below the substrate 418 does not impede connections of the external interconnects 436 to the next system level.

The fourth multichip package system 400 places the first integrated circuit die 404 and the second integrated circuit die 406 close to each other and to the next system level. This minimal distance allows high speed communication with potentially lower electrical swing signals between the first integrated circuit die 404 and the second integrated circuit die 406 as well as to the next system level resulting in performance improvement and lower power consumption. The first interconnects 422 and the second interconnects 446 both as ribbon bond wires may further improve the electrical performance. For example, the second integrated circuit die 406 may be a processor requiring high speed memory access, such as an external level 1 (L1) cache. The first integrated circuit die 404 may be the L1 memory. Communication between the processor and the L1 cache may be both high speed and low power. Further, the processor or the memory chip may communicate with the next system level through the substrate 418 and the external interconnects 436.

Figure 5:
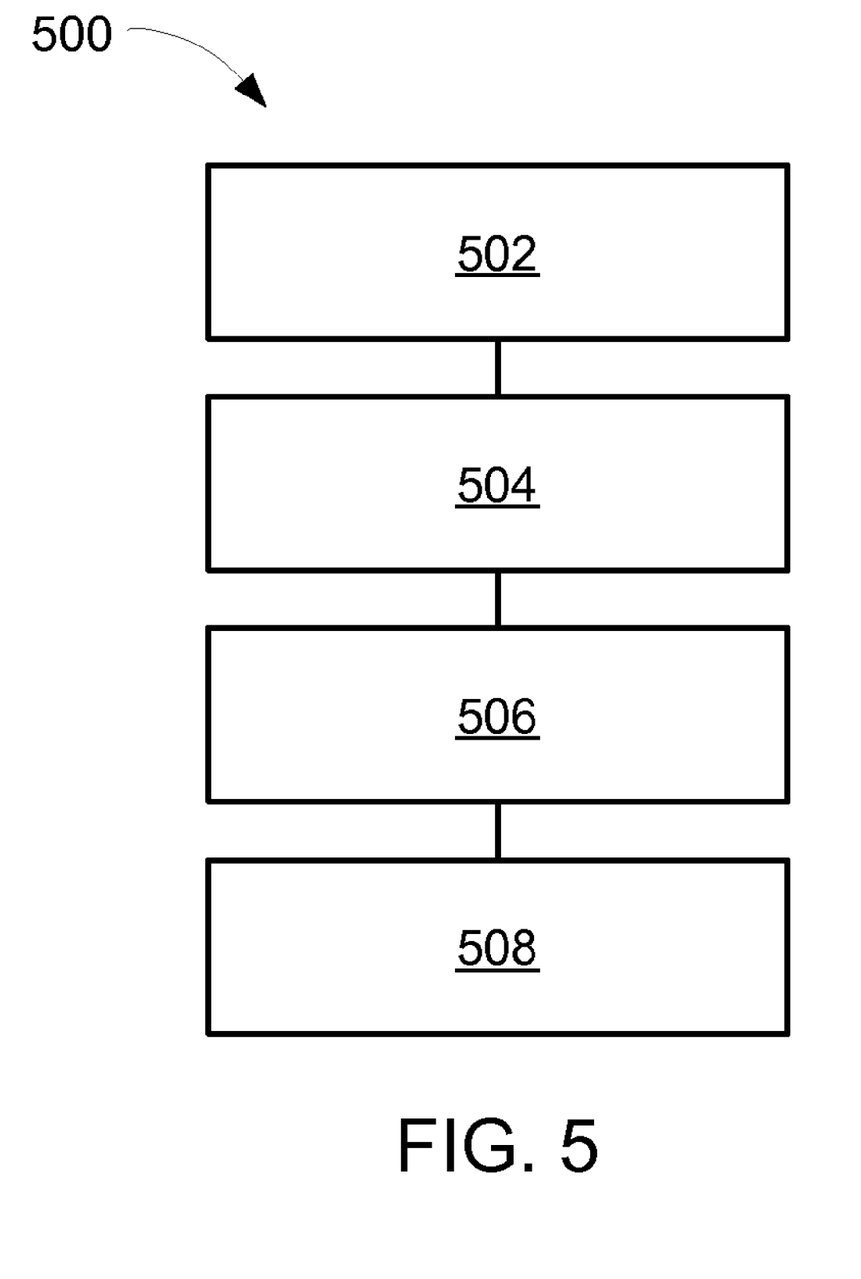
FIG. 5 is a flow chart of a multichip package system for manufacture of the multichip package in an embodiment of the present invention.

Referring now to FIG. 5, therein is shown a flow chart of a multichip package system 500 for manufacture of the multichip package system 100 in an embodiment of the present invention. The system 500 includes attaching a first integrated circuit die on a substrate top surface in a block 502; mounting a second integrated circuit die over the first integrated circuit die in a block 504; connecting an external interconnect on a substrate bottom surface in a block 506; and forming a first encapsulation having a recess to expose a portion of the substrate bottom surface and the external interconnect in a block 508.

It has been discovered that the present invention thus has numerous aspects.

It has been discovered that integrated multiple chips in a package with close proximity to each other and to the external interconnects improves communication between the integrated circuits in the package as well as outside the package. These results in improved electrical performance, frequency, signal integrity, and lower power consumption between the integrated circuits as well as to the external world.

An aspect is that the present invention is that the places the first integrated circuit die and the second integrated circuit die close to each other and to the next system level. This minimal distance allows high speed communication with potentially lower electrical swing signals between the first integrated circuit die and the second integrated circuit die as well as to the next system level resulting in performance improvement and lower power consumption.

Another aspect of the present invention is that the ribbon bond wires may further improve the electrical performance, increase signal frequency, improve signal integrity, and lower power consumption of the multichip package system. The ribbon bond wires increases conductance while reducing mutual inductance and cross talk between the ribbon wires compared to the round bond wires.

Yet another aspect of the present invention is that the microelectronic elements are stacked closely together in a vertical configuration, and connected to one another. Stacking the microelectronic elements closely together reduces both the distance between the microelectronic elements and the length of the conductive traces interconnecting the microelectronic elements. As a result, the signal transmission time between the microelectronic elements will be shorter and the clock speed of the microelectronic elements may be increased. In certain cases, the chips packaged in the multichip package system can perform more functions in the same amount of time than similar chips provided in standard microelectronic packages. For example, the operating speed of a microprocessor is sometimes limited by the speed at which the microprocessor can exchange data with an associated memory. The rate of data exchange, and hence the speed of operation of the microprocessor, may be increased.

Yet another aspect of the present invention is that an additional coverlay tape attach process is not necessary. The center gate mold formed between the recessed surfaces and from the openings of the dielectric substrate does not require protection of dielectric element or use normal transfer mold.

Yet another aspect of the present invention is that the first microelectronic element may be attached to the second microelectronic element at the wafer level. More than two microelectronic elements may be integrated a vertical configuration, a horizontal configuration, or a combination thereof. The direct communication between the microelectronic elements in the multichip package eases the input/output congestion on the next system level.

Thus, it has been discovered that the multichip package system method of the present invention furnishes important and heretofore unknown and unavailable solutions, capabilities, and functional aspects for increasing chip density and performance improvements in systems. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

The Invention claimed is:

1. A multichip integrated circuit package system comprising:
   providing a substrate having a substrate top surface and a substrate bottom surface;
   attaching a first integrated circuit die on the substrate top surface;
   encapsulating the first integrated circuit die in a first encapsulation;
   mounting a second integrated circuit die over the first integrated circuit die;
   attaching an interconnect to the substrate bottom surface and the second integrated circuit die;
   connecting an external interconnect on the substrate bottom surface; and forming a second encapsulation over the interconnect and having a recess to expose a portion of the substrate bottom surface and the external interconnect.

2. The system as claimed in claim 1 wherein:
attaching the first integrated circuit die on the substrate top surface comprises:
electrically connecting the first integrated circuit die and the substrate top surface; and
further comprising:
electrically connecting the second integrated circuit die and the substrate bottom surface.

3. The system as claimed in claim 1 further comprising:
electrically connecting the first integrated circuit die and the substrate bottom surface; and
electrically connecting the first integrated circuit die and the second integrated circuit die.

4. The system as claimed in claim 1 further comprising:
forming a second substrate having an opening, the second substrate having a second substrate top surface and a second substrate bottom surface; and electrically connecting the first integrated circuit die and the second substrate bottom surface through the opening.

5. The system as claimed in claim 1 further comprising:
electrically connecting the first integrated circuit die and the substrate bottom surface; and electrically connecting the first integrated circuit die and the second integrated circuit die.

6. A multichip integrated circuit package system comprising:
providing a substrate having a substrate top surface and a substrate bottom surface;
attaching a first integrated circuit die on the substrate top surface, having a first conductive trace;
encapsulating the first integrated circuit die in the first encapsulation;
mounting a second integrated circuit die over the first integrated circuit die with an adhesive on an active side of the second integrated circuit die;
attaching an interconnect to the substrate bottom surface and the second integrated circuit die;
connecting an external interconnect on the substrate bottom surface, having a second conductive trace; and
forming a second encapsulation over the interconnect and having a recess to expose a portion of the substrate bottom surface and the external interconnect as well as covering the substrate top surface.

7. The system as claimed in claim 6 wherein:
attaching the first integrated circuit die on the substrate top surface comprises:
electrically connecting the first integrated circuit die and a first peripheral portion of the substrate top surface; and
further comprising:
partially encapsulating the second integrated circuit die; and
electrically connecting the second integrated circuit die and a second peripheral portion of the substrate bottom surface.

8. The system as claimed in claim 6 further comprising:
electrically connecting the first integrated circuit die and a peripheral portion of the substrate bottom surface;
electrically connecting the first integrated circuit die and the second integrated circuit die; and
partially encapsulating the second integrated circuit die.

9. The system as claimed in claim 6 further comprising:
forming a second substrate having an opening, the second substrate having a second substrate top surface and a second substrate bottom surface; electrically connecting the first integrated circuit die and a flexible lead on the second substrate bottom surface through the opening.

10. The system as claimed in claim 6 further comprising:
electrically connecting the first integrated circuit die and a flexible lead of the substrate bottom surface; and electrically connecting the first integrated circuit die and the second integrated circuit die.

11. A multichip integrated circuit package system comprising:
a substrate having a substrate top surface and a substrate bottom surface;
a first integrated circuit die on the substrate top surface;
a first encapsulation over the first integrated circuit die;
a second integrated circuit die over the first integrated circuit die;
an interconnect attached to the substrate bottom surface and the second integrated circuit die;
an external interconnect on the substrate bottom surface; and
a second encapsulation over the interconnect and having a recess to expose a portion of the substrate bottom surface and the external interconnect.

12. The system as claimed in claim 11 wherein:
the first integrated circuit die on the substrate top surface comprises:
a first interconnect between the first integrated circuit die and the substrate top surface; and
further comprising:
a second interconnect between the second integrated circuit die and the substrate bottom surface.

13. The system as claimed in claim 11 further comprising:
a first interconnect between the first integrated circuit die and the substrate bottom surface; and
a second interconnect between the first integrated circuit die and the second integrated circuit die.

14. The system as claimed in claim 11 further comprising:
a second substrate having an opening, the second substrate having a second substrate top surface and a second substrate bottom surface; and an interconnect between the first integrated circuit die and the second substrate bottom surface through the opening.

15. The system as claimed in claim 11 further comprising:
a first interconnect between the first integrated circuit die and the substrate bottom surface;
a second interconnect between the first integrated circuit die and the second integrated circuit die; and
the second encapsulation to cover the first integrated circuit die and the second integrated circuit die.

16. The system as claimed in claim 11 wherein:
the first integrated circuit die is on the substrate top surface, the substrate top surface having a first conductive trace;
the second integrated circuit die is over the first integrated circuit die with an adhesive on an active side of the second integrated circuit die;
the external interconnect is on the substrate bottom surface, the substrate bottom surface having a second conductive trace; and
the second encapsulation covers the substrate top surface.

17. The system as claimed in claim 16 wherein:
the first integrated circuit die on the substrate top surface comprises:
a first interconnect is between the first integrated circuit die and a first peripheral portion of the substrate top surface; and
further comprising:
the second encapsulation partially covers the second integrated die; and a second interconnect between the second integrated circuit die and a second peripheral portion of the substrate bottom surface.

18. The system as claimed in claim 16 further comprising:
a first interconnect between the first integrated circuit die and a peripheral portion of the substrate bottom surface;
a second interconnect between the first integrated circuit die and the second integrated circuit die; and
the second encapsulation partially covers the second integrated circuit die.

19. The system as claimed in claim 16 further comprising:
a second substrate having an opening, the second substrate having a second substrate top surface and a second substrate bottom surface; and a first interconnect between the first integrated circuit die and a flexible lead on the second substrate bottom surface through the opening.

20. The system as claimed in claim 16 further comprising:
a first interconnect between the first integrated circuit die and a flexible lead of the substrate bottom surface; and
a second interconnect between the first integrated circuit die and the second integrated circuit die.

* * * * *

UNITED STATES PATENT AND TRADEMARK OFFICE
CERTIFICATE OF CORRECTION

PATENT NO. : 7,710,735 B2  Page 1 of 1
APPLICATION NO. : 11/278418
DATED : May 4, 2010
INVENTOR(S) : Bae et al.

It is certified that error appears in the above-identified patent and that said Letters Patent is hereby corrected as shown below:

Column 10, claim 17, lines 66-67, delete "integrated die;" and insert therefor

--integrated circuit die;--

Signed and Sealed this

Sixth Day of July, 2010

David J. Kappos
*Director of the United States Patent and Trademark Office*